(12) United States Patent
Harada

(10) Patent No.: US 10,348,268 B2
(45) Date of Patent: Jul. 9, 2019

(54) DEMULTIPLEXING CIRCUIT

(71) Applicant: Murata Manufacturing Co., Ltd., Kyoto (JP)

(72) Inventor: Tetsuro Harada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/849,930

(22) Filed: Dec. 21, 2017

(65) Prior Publication Data

US 2018/0167049 A1    Jun. 14, 2018

Related U.S. Application Data

(63) Continuation of application No. PCT/JP2016/068338, filed on Jun. 21, 2016.

(30) Foreign Application Priority Data

Jun. 24, 2015    (JP) ................. 2015-126652

(51) Int. Cl.
*H03H 7/40* (2006.01)
*H04B 1/50* (2006.01)
(Continued)

(52) U.S. Cl.
CPC ............. *H03H 7/40* (2013.01); *H03H 7/465* (2013.01); *H04B 1/0057* (2013.01); *H04B 1/50* (2013.01); *H03H 2007/386* (2013.01)

(58) Field of Classification Search
CPC .......... H04B 1/0057; H04B 1/50; H03H 7/40; H03H 7/465; H03H 2007/386
See application file for complete search history.

(56) References Cited

U.S. PATENT DOCUMENTS

| 2003/0006859 A1 | 1/2003 | Taniguchi |
| 2004/0127182 A1* | 7/2004 | Hayashi .................. H01P 1/15 455/193.1 |

(Continued)

FOREIGN PATENT DOCUMENTS

| JP | 2006-523050 A | 10/2006 |
| JP | 2011-182271 A | 9/2011 |

(Continued)

OTHER PUBLICATIONS

InnovationQ search; Feb. 12, 2019 (Year: 2019).*

(Continued)

*Primary Examiner* — Benjamin H Elliott, IV
(74) *Attorney, Agent, or Firm* — Pearne & Gordon LLP

(57) ABSTRACT

A demultiplexing circuit (10) includes a band switch (20) and a first communication band phase adjustment circuit (30). The band switch (20) includes a shared terminal (P20) connected to a shared connection end (110), a first selection target terminal (P21) connected to a second signal end (122), and a second selection target terminal (P22) connected to a third signal end (123). In the band switch (20), the first selection target terminal (P21) and the second selection target terminal (P22) are selectively connected to the shared terminal (P20) in response to the communication band to be transmitted. The first communication band phase adjustment circuit (30) is connected between a first signal end (121) and a predetermined position in a transmission path where the shared connection end (110) and the shared terminal (P20) are connected.

15 Claims, 4 Drawing Sheets

(51) Int. Cl.
*H03H 7/46* (2006.01)
*H04B 1/00* (2006.01)
*H03H 7/38* (2006.01)

(56) References Cited

U.S. PATENT DOCUMENTS

| | | | |
|---|---|---|---|
| 2006/0194550 A1 | 8/2006 | Block et al. | |
| 2008/0129410 A1* | 6/2008 | Fukuda | H03F 1/0288 |
| | | | 333/129 |
| 2009/0185512 A1* | 7/2009 | Hayakawa | H03H 7/463 |
| | | | 370/297 |
| 2009/0206948 A1* | 8/2009 | Kemmochi | H04B 1/0057 |
| | | | 333/126 |
| 2010/0091752 A1* | 4/2010 | Kemmochi | H03H 7/09 |
| | | | 370/339 |
| 2012/0112853 A1* | 5/2012 | Hikino | H03H 7/0115 |
| | | | 333/132 |
| 2012/0224514 A1* | 9/2012 | Shibata | H04B 1/0057 |
| | | | 370/277 |
| 2014/0169422 A1* | 6/2014 | Hayafuji | H03H 7/40 |
| | | | 375/219 |
| 2015/0028963 A1* | 1/2015 | Ebihara | H03H 7/465 |
| | | | 333/126 |
| 2016/0112072 A1* | 4/2016 | Bauder | H04B 1/0057 |
| | | | 370/297 |
| 2016/0204819 A1* | 7/2016 | Hsin | H04B 1/0057 |
| | | | 455/84 |
| 2018/0159562 A1* | 6/2018 | Bauder | H04B 1/0057 |
| 2018/0167049 A1* | 6/2018 | Harada | H04B 1/50 |

FOREIGN PATENT DOCUMENTS

| | | |
|---|---|---|
| JP | 2012-186623 A | 9/2012 |
| JP | 2015-029233 A | 2/2015 |
| JP | 2012-100180 A | 5/2015 |
| KR | 10-2002-0083443 A | 11/2002 |
| KR | 10-2004-0025616 A | 3/2004 |
| KR | 10-2007-0068103 A | 6/2007 |
| WO | 2013/027580 A1 | 2/2013 |

OTHER PUBLICATIONS

International Search Report for PCT/JP2016/068338 dated Sep. 20, 2016.
Written Opinion for for PCT/JP2016/068338 dated Sep. 20, 2016.
Korean Office Action for Application No. 10-2017-7033512, dated Feb. 21, 2019.

* cited by examiner

[FIG.1]
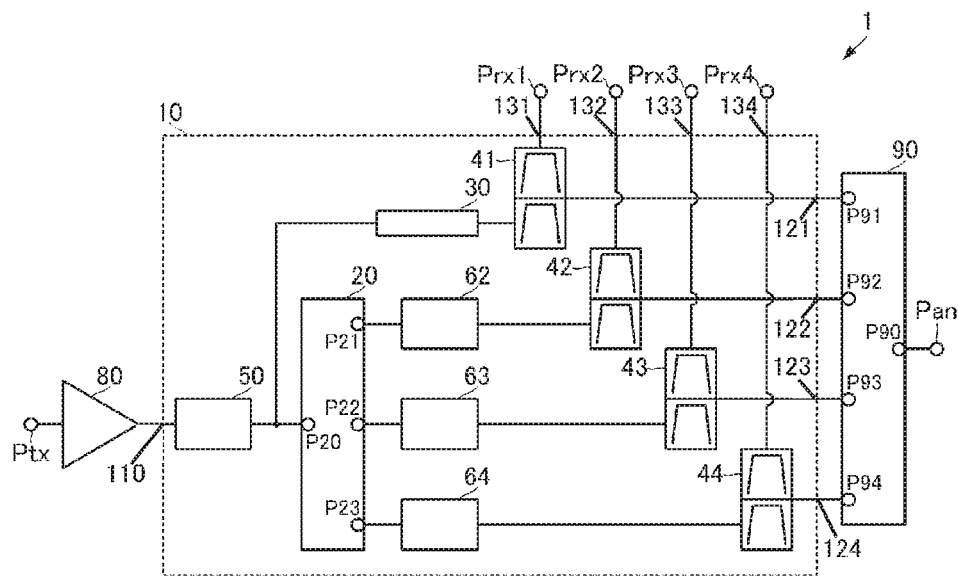
[FIG.2]
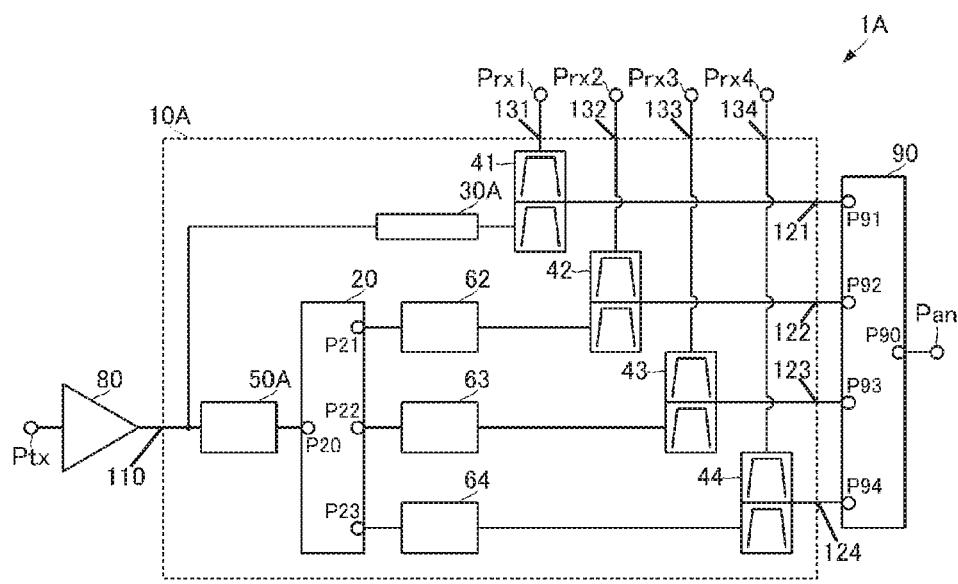

[FIG.3]
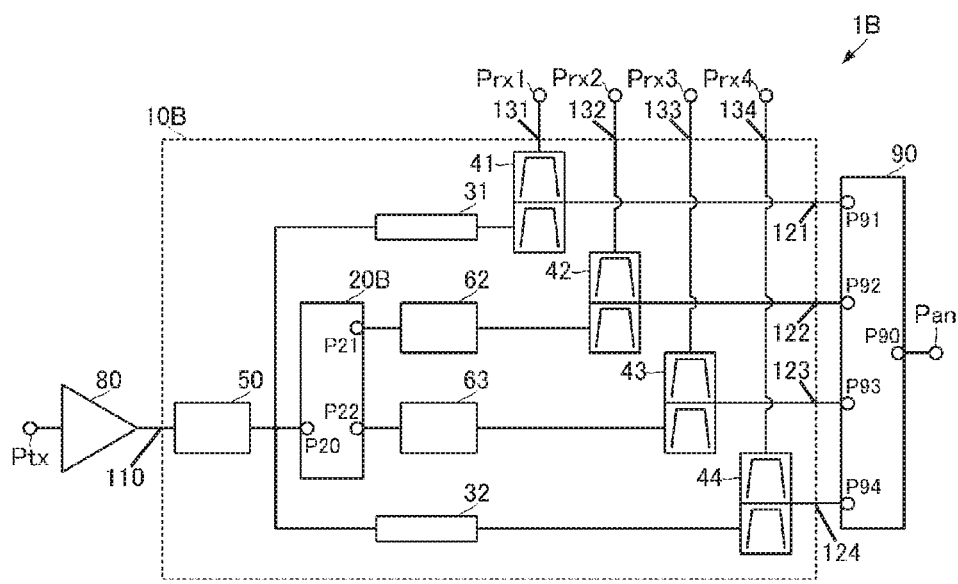
[FIG.4]
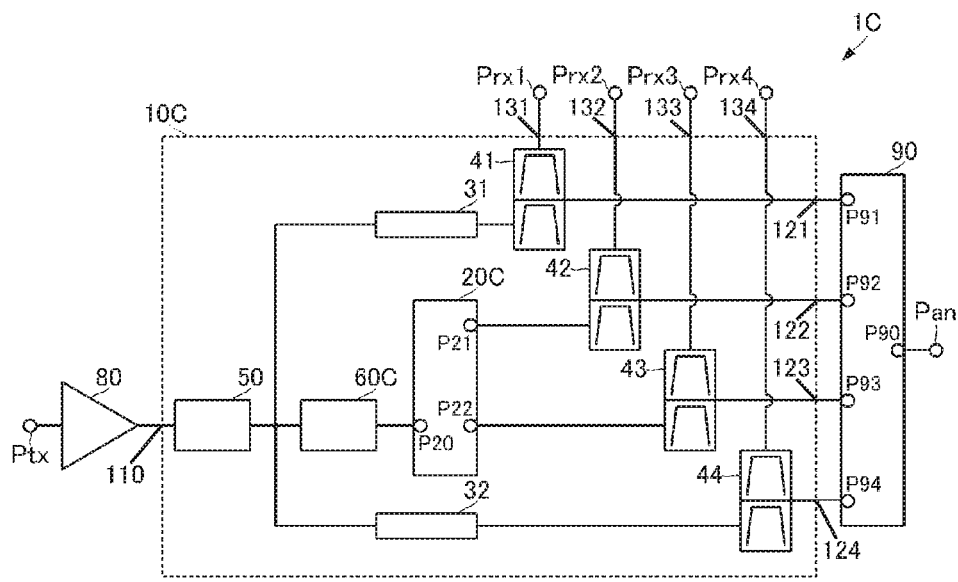

[FIG.5]
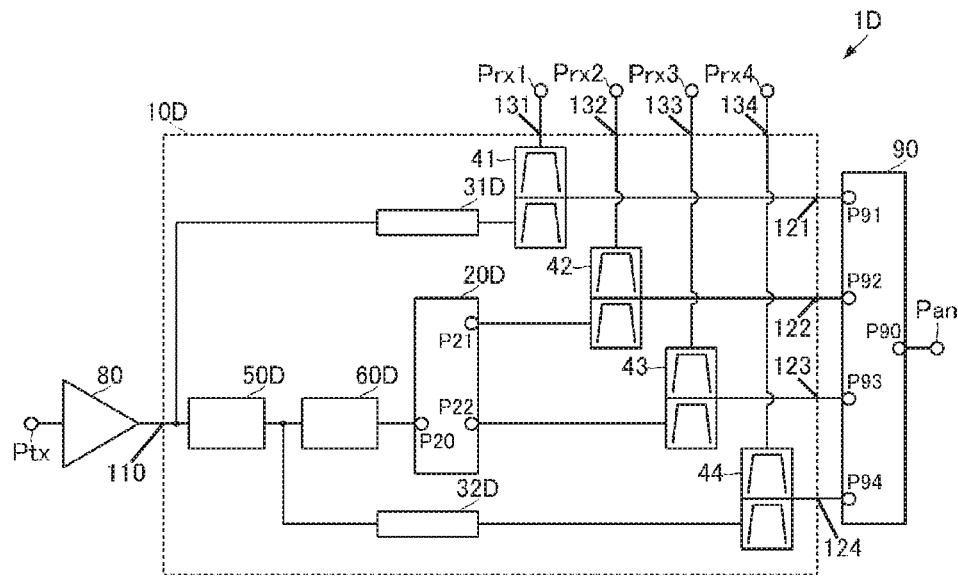
[FIG.6]
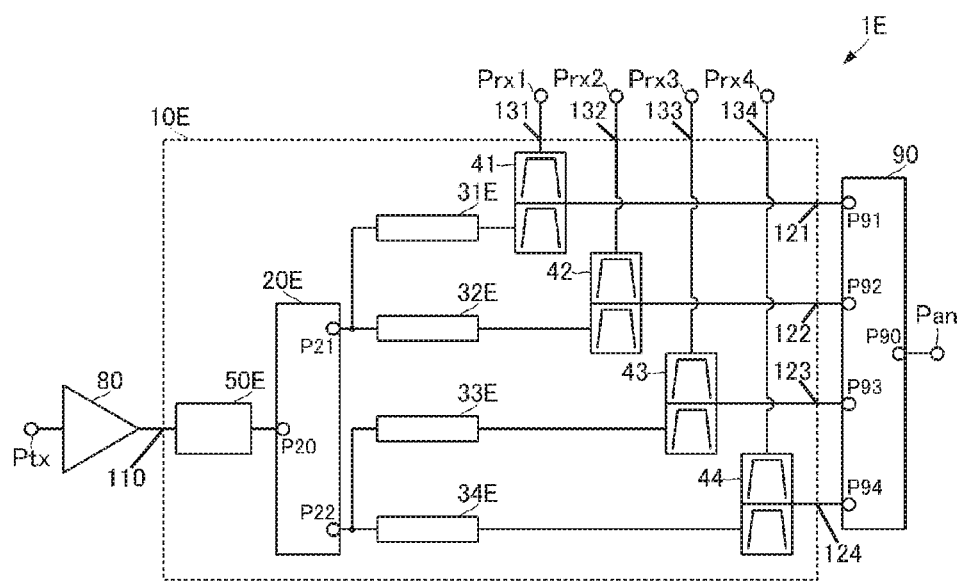

[FIG.7]
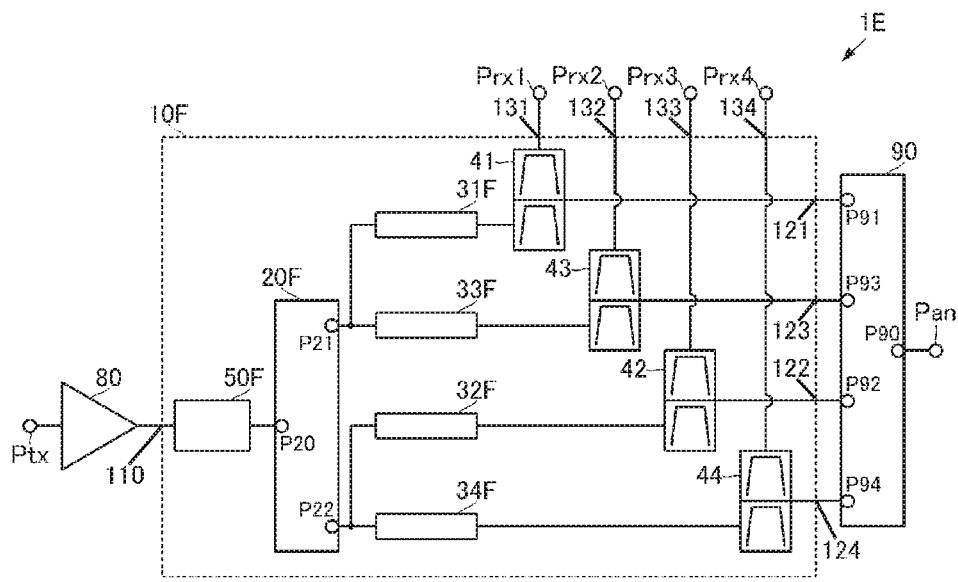
[FIG.8]
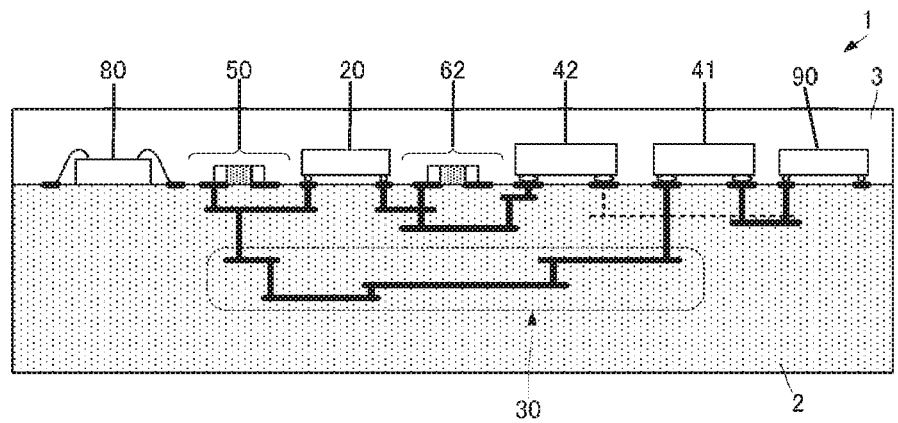
[FIG.9]
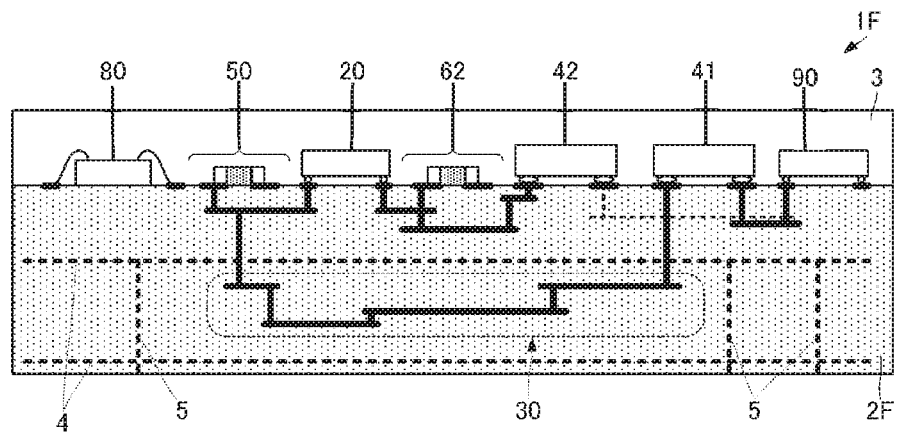

DEMULTIPLEXING CIRCUIT

This application is a continuation of International Application No. PCT/JP2016/068338 filed on Jun. 21, 2016 which claims priority from Japanese Patent Application No. 2015-126652 filed on Jun. 24, 2015. The contents of these applications are incorporated herein by reference in their entireties.

BACKGROUND OF THE DISCLOSURE

Field of the Disclosure

The present disclosure relates to a demultiplexing circuit configured to demultiplex high frequency signals of a plurality of communication bands.

Description of the Related Art

Patent Document 1 discloses a wireless communication device including a multi-band amplifier (multi-band PA). The wireless communication device in Patent Document 1 includes the multi-band amplifier, a band switch circuit, and duplexers. The duplexers are provided for each of the communication bands.

The band switch circuit includes a shared terminal and a plurality of selection target terminals. The shared terminal of the band switch circuit is connected to a signal end of the multi-band amplifier. The plurality of selection target terminals of the band switch circuit are respectively connected to the duplexers corresponding to individual communication bands. The plurality of selection target terminals of the band switch circuit are selected in response to the communication band to be transmitted and connected to the shared terminal.

Patent Document 1: Japanese Unexamined Patent Application Publication No. 2011-182271

BRIEF SUMMARY OF THE DISCLOSURE

However, the wireless communication device described in Patent Document 1 needs the same number of selection target terminals as the number of communication bands. Accordingly, as the number of communication bands that the wireless communication device supports increases, the number of selection target terminals also increases in proportion to the increased number of the communication bands.

As the selection target terminals increase in number, parasitic capacitance increases in the band switch circuit being influenced by the selection target terminals that are not selected, whereby the transmission characteristics are degraded. In addition, as the selection target terminals increase in number, the control system becomes complex accordingly.

An object of the present disclosure is to provide a demultiplexing circuit in which transmission characteristics for high frequency signals of respective communication bands are not degraded even if the number of communication bands is large.

The present disclosure relates to a demultiplexing circuit configured to demultiplex a high frequency signal of a first communication band, a high frequency signal of a second communication band, and a high frequency signal of a third communication band, where the first through third communication bands respectively have different frequency bands. The demultiplexing circuit includes a shared connection end to which high frequency signals of all the communication bands are inputted, a first signal end from which the high frequency signal of the first communication band is outputted, a second signal end from which the high frequency signal of the second communication band is outputted, and a third signal end from which the high frequency signal of the third communication band is outputted. The demultiplexing circuit includes a band switch and a first communication band phase adjustment circuit. The band switch includes a shared terminal connected to the shared connection end, a first selection target terminal connected to the second signal end, and a second selection target terminal connected to the third signal end. In the band switch, the first selection target terminal and the second selection target terminal are selectively connected to the shared terminal in response to the communication band to be transmitted. The first communication band phase adjustment circuit is connected between the first signal end and a predetermined position in a transmission path where the shared connection end and the shared terminal are connected.

In this configuration, the high frequency signal of the first communication band is transmitted without passing through the band switch. The isolation between the first communication band and the second and third communication bands is secured by the first communication band phase adjustment circuit.

The demultiplexing circuit of the present disclosure may be configured as follows. The demultiplexing circuit includes a shared matching circuit connected between the shared terminal and the shared connection end. The first communication band phase adjustment circuit is connected to the shared connection end side of the shared matching circuit.

In this configuration, matching of the second communication band and the third communication band is carried out by the shared matching circuit, while matching of the first communication band is carried out only by the first communication band phase adjustment circuit. The isolation between the first communication band and the second and third communication bands is secured by the first communication band phase adjustment circuit and the shared matching circuit.

The demultiplexing circuit of the present disclosure may be configured as follows. The demultiplexing circuit includes a fourth signal end and a fourth communication band phase adjustment circuit. A high frequency signal of a fourth communication band different from the first, second, and third communication bands is transmitted through the fourth signal end. The fourth communication band phase adjustment circuit is connected between the fourth signal end and a predetermined position in a transmission path where the shared connection end and the shared terminal are connected.

In this configuration, the high frequency signal of the fourth communication band is transmitted without passing through the band switch. The isolation between the fourth communication band and the second and third communication bands is secured by the fourth communication band phase adjustment circuit. The isolation between the fourth communication band and the first communication band is secured by the first communication band phase adjustment circuit and the fourth communication band phase adjustment circuit.

The demultiplexing circuit of the present disclosure may be configured as follows. The demultiplexing circuit includes a shared matching circuit connected between the shared terminal and the shared connection end. The first communication band phase adjustment circuit is connected to the shared connection end side of the shared matching circuit. The fourth communication band phase adjustment circuit is connected to the shared terminal side of the shared matching circuit.

With this configuration, connection modes of the communication band phase adjustment circuits for a plurality of communication bands that do not pass through any band switch can be appropriately selected so that the desired phase adjustment can be adequately set.

It is preferable that the demultiplexing circuit of the present disclosure include at least one of a second communication band-dedicated matching circuit connected between the first selection target terminal and the second signal end, and a third communication band-dedicated matching circuit connected between the second selection target terminal and the third signal end.

With this configuration, the matching of the second communication band and the third communication band can be carried out more accurately.

The demultiplexing circuit of the present disclosure may be configured as follows. The demultiplexing circuit includes a fifth signal end, a second communication band phase adjustment circuit, and a fifth communication band phase adjustment circuit. A high frequency signal of the fifth communication band different from the first, second, and third communication bands is transmitted through the fifth signal end, and the fifth signal end is connected to the first selection target terminal. The second communication band phase adjustment circuit is connected between the second signal end and the first selection target terminal. The fifth communication band phase adjustment circuit is connected between the fifth signal end and the first selection target terminal.

With this configuration, the number of communication bands to be transmitted can be increased without an increase of the number of selection target terminals of the band switch.

A demultiplexing circuit of the present disclosure may be configured as follows. The demultiplexing circuit includes a shared connection end to which high frequency signals of all the communication bands are inputted, a first signal end through which the high frequency signal of the first communication band is transmitted, a second signal end through which the high frequency signal of the second communication band is transmitted, and a third signal end through which the high frequency signal of the third communication band is transmitted. The demultiplexing circuit includes a band switch, a first communication band phase adjustment circuit, and a second communication band phase adjustment circuit. The band switch includes a shared terminal connected to the shared connection end, a first selection target terminal connected to the first signal end and the second signal end, and a second selection target terminal connected to the third signal end. In the band switch, the first selection target terminal and the second selection target terminal are selectively connected to the shared terminal in response to the communication band to be transmitted. The first communication band phase adjustment circuit is connected between the first signal end and the first selection target terminal. The second communication band phase adjustment circuit is connected between the first signal end and the second selection target terminal.

With this configuration, the number of communication bands to be transmitted can be increased without an increase of the number of selection target terminals of the band switch.

It is preferable in the demultiplexing circuit of the present disclosure that a difference between a frequency band of the first communication band and a frequency band of the second communication band or a frequency band of the third communication band be greater than a difference between the frequency band of the second communication band and the frequency band of the third communication band.

It is preferable for the demultiplexing circuit of the present disclosure to satisfy any one of the following conditions. The frequency band of the first communication band is not present between the frequency band of the second communication band and the frequency band of the third communication band on the frequency axis. The frequency band of the first communication band is present between the frequency band of the second communication band and the frequency band of the third communication band on the frequency axis.

With these configurations, the above-discussed configurations can be more easily realized, and the above-discussed effects become more effective.

According to the present disclosure, even if a plurality of communication bands are demultiplexed and transmitted, the degradation in transmission characteristics for high frequency signals of the respective communication bands can be suppressed.

BRIEF DESCRIPTION OF THE SEVERAL VIEWS OF THE DRAWINGS

FIG. 1 is a circuit block diagram of a high frequency front-end circuit including a demultiplexing circuit according to a first embodiment of the present disclosure.

FIG. 2 is a circuit block diagram of a high frequency front-end circuit including a demultiplexing circuit according to a second embodiment of the present disclosure.

FIG. 3 is a circuit block diagram of a high frequency front-end circuit including a demultiplexing circuit according to a third embodiment of the present disclosure.

FIG. 4 is a circuit block diagram of a high frequency front-end circuit including a demultiplexing circuit according to a fourth embodiment of the present disclosure.

FIG. 5 is a circuit block diagram of a high frequency front-end circuit including a demultiplexing circuit according to a fifth embodiment of the present disclosure.

FIG. 6 is a circuit block diagram of a high frequency front-end circuit including a demultiplexing circuit according to a sixth embodiment of the present disclosure.

FIG. 7 is a circuit block diagram of a high frequency front-end circuit including a demultiplexing circuit according to a seventh embodiment of the present disclosure.

FIG. 8 is a cross-sectional view illustrating a general structure of a module component to configure a high frequency front-end circuit according to an eighth embodiment of the present disclosure.

FIG. 9 is a cross-sectional view illustrating a general structure of a module component to configure a high frequency front-end circuit according to a ninth embodiment of the present disclosure.

DETAILED DESCRIPTION OF THE DISCLOSURE

A demultiplexing circuit according to a first embodiment of the present disclosure will be described with reference to the drawings. FIG. 1 is a circuit block diagram of a high frequency front-end circuit including a demultiplexing circuit according to the first embodiment of the present disclosure.

In the present embodiment, modes in which a first communication band, a second communication band, a third communication band, and a fourth communication band are transmitted will be described. A frequency band of the first communication band is distanced from frequency bands of the second communication band, the third communication band, and the fourth communication band. To rephrase, a difference between the center frequency of the frequency band of the first communication band and the center frequency of the frequency band of the second communication band is greater than a difference between the center frequency of the frequency band of the second communication band and the center frequency of the frequency band of the third communication band as well as a difference between the center frequency of the frequency band of the second communication band and the center frequency of the frequency band of the fourth communication band. The same can be applied to the third communication band and the fourth communication band.

A high frequency front-end circuit 1 includes a demultiplexing circuit 10, a multi-band amplifier 80, and a main switch 90. The demultiplexing circuit 10 includes a shared connection end 110, and signal ends 121, 122, 123, 124, 131, 132, 133, and 134.

The shared connection end 110 corresponds to a "shared connection end" of the present disclosure. Transmission signals of all the communication bands are inputted to the shared connection end 110. The signal end 121 corresponds to a "first signal end" of the present disclosure. The transmission signal of the first communication band is outputted from the signal end 121, and a reception signal of the first communication band is inputted to the signal end 121. The signal end 122 corresponds to a "second signal end" of the present disclosure. The transmission signal of the second communication band is outputted from the signal end 122, and a reception signal of the second communication band is inputted to the signal end 122. The signal end 123 corresponds to a "third signal end" of the present disclosure. The transmission signal of the third communication band is outputted from the signal end 123, and a reception signal of the third communication band is inputted to the signal end 123. The transmission signal of the fourth communication band is outputted from the signal end 124, and a reception signal of the fourth communication band is inputted to the signal end 124. In the present embodiment, the signal end 124 also corresponds to the "third signal end" of the present disclosure.

A signal terminal of the multi-band amplifier 80 is connected to the shared connection end 110. A shared connection terminal of the multi-band amplifier 80 is connected to a transmission signal shared connection terminal Ptx of the high frequency front-end circuit 1. The multi-band amplifier 80 is configured to amplify and output the transmission signals of all the communication bands.

The main switch 90 includes a shared terminal P90, and a plurality of selection target terminals P91, P92, P93, and P94. The shared terminal P90 is connected to an antenna terminal Pan of the high frequency front-end circuit 1. The selection target terminal P91 is connected to the signal end 121. The selection target terminal P92 is connected to the signal end 122. The selection target terminal P93 is connected to the signal end 123. The selection target terminal P94 is connected to the signal end 124.

The shared terminal P90 is selectively connected to the plurality of selection target terminals P91, P92, P93, and P94. The shared terminal P90 is connected to the selection target terminal P91 when the first communication band is transmitted/received. The shared terminal P90 is connected to the selection target terminal P92 when the second communication band is transmitted/received. The shared terminal P90 is connected to the selection target terminal P93 when the third communication band is transmitted/received. The shared terminal P90 is connected to the selection target terminal P94 when the fourth communication band is transmitted/received.

The signal ends 131, 132, 133, and 134 are respectively connected to reception signal output terminals Prx1, Prx2, Prx3, and Prx4 of the high frequency front-end circuit 1.

The demultiplexing circuit 10 includes a band switch 20, a phase adjustment circuit 30, duplexers 41, 42, 43 and 44, a shared matching circuit 50, and communication band-dedicated matching circuits 62, 63 and 64.

The band switch 20 includes a shared terminal P20, and a plurality of selection target terminals P21, P22, and P23. The shared terminal P20 corresponds to a "shared terminal" of the present disclosure. The shared terminal P20 is connected to the shared connection end 110 with the shared matching circuit 50 interposed therebetween. The selection target terminal P21 corresponds to a "first selection target terminal" of the present disclosure. The selection target terminal P21 is connected to the signal end 122 with the communication band-dedicated matching circuit 62 and the duplexer 42 interposed therebetween. The selection target terminal P22 corresponds to a "second selection target terminal" of the present disclosure. The selection target terminal P22 is connected to the signal end 123 with the communication band-dedicated matching circuit 63 and the duplexer 43 interposed therebetween. The selection target terminal P23 is connected to the signal end 124 with the communication band-dedicated matching circuit 64 and the duplexer 44 interposed therebetween. The shared terminal P20 is connected to the selection target terminal P21 when the second communication band is transmitted. The shared terminal P20 is connected to the selection target terminal P22 when the third communication band is transmitted. The shared terminal P20 is connected to the selection target terminal P23 when the fourth communication band is transmitted.

The phase adjustment circuit 30 corresponds to a "first communication band phase adjustment circuit" of the present disclosure. One end of the phase adjustment circuit 30 is connected to a predetermined position between the shared matching circuit 50 and the shared terminal P20 in a transmission path connecting the shared connection end 110 and the shared terminal P20 of the band switch 20. The other end of the phase adjustment circuit 30 is connected to the signal end 121 with the duplexer 41 interposed therebetween.

A transmission filter of the duplexer 41 is connected between the phase adjustment circuit 30 and the signal end 121. The transmission filter of the duplexer 41 passes the transmission signal of the first communication band therethrough with low loss and attenuates signals of other frequencies. A reception filter of the duplexer 41 is connected between the signal end 121 and the signal end 131. The reception filter of the duplexer 41 passes the reception signal of the first communication band therethrough with low loss and attenuates signals of other frequencies.

A transmission filter of the duplexer 42 is connected between the communication band-dedicated matching circuit 62 and the signal end 122. The transmission filter of the duplexer 42 passes the transmission signal of the second communication band therethrough with low loss and attenuates signals of other frequencies. A reception filter of the duplexer 42 is connected between the signal end 122 and the signal end 132. The reception filter of the duplexer 42 passes the reception signal of the second communication band therethrough with low loss and attenuates signals of other frequencies.

A transmission filter of the duplexer 43 is connected between the communication band-dedicated matching circuit 63 and the signal end 123. The transmission filter of the duplexer 43 passes the transmission signal of the third communication band therethrough with low loss and attenuates signals of other frequencies. A reception filter of the duplexer 43 is connected between the signal end 123 and the signal end 133. The reception filter of the duplexer 43 passes the reception signal of the third communication band therethrough with low loss and attenuates signals of other frequencies.

A transmission filter of the duplexer 44 is connected between the communication band-dedicated matching circuit 64 and the signal end 124. The transmission filter of the duplexer 44 passes the transmission signal of the fourth communication band therethrough with low loss and attenuates signals of other frequencies. A reception filter of the duplexer 44 is connected between the signal end 124 and the signal end 134. The reception filter of the duplexer 44 passes the reception signal of the fourth communication band therethrough with low loss and attenuates signals of other frequencies.

With the above-discussed circuit configuration, the phase adjustment circuit 30, the shared matching circuit 50, and the communication band-dedicated matching circuits 62, 63 and 64 respectively have the following characteristics.

The phase adjustment circuit 30 performs phase-matching on the frequency band of the transmission signal of the first communication band. At the same time, the phase adjustment circuit 30 performs phase-mismatching on the frequency bands of the transmission signals of the second, third, and fourth communication bands. The phase adjustment circuit 30 is configured with a circuit including an inductor and a capacitor.

The shared matching circuit 50 includes a circuit configuration that makes impedance approach the desired values to some degree for the frequency bands of the transmission signals of all the communication bands. The shared matching circuit 50 is configured with a circuit including an inductor and a capacitor.

The communication band-dedicated matching circuit 62 includes a circuit configuration that makes the impedance further approach the desired value for the frequency band of the transmission signal of the second communication band. The communication band-dedicated matching circuit 63 includes a circuit configuration that makes the impedance further approach the desired value for the frequency band of the transmission signal of the third communication band. The communication band-dedicated matching circuit 64 includes a circuit configuration that makes the impedance further approach the desired value for the frequency band of the transmission signal of the fourth communication band. The communication band-dedicated matching circuits 62, 63, and 64, although element values and configurations thereof are different from each other, are each configured with a circuit including an inductor and a capacitor.

When the transmission signal of the first communication band is inputted from the shared connection end 110, the transmission signal is allowed to pass through the shared matching circuit 50 and the phase adjustment circuit 30, and is outputted to the duplexer 41. By the shared matching circuit 50 and the phase adjustment circuit 30 being set as discussed above, the transmission signal of the first communication band is inputted with low loss to the duplexer 41. The transmission filter of the duplexer 41 passes the transmission signal of the first communication band therethrough with low loss and attenuates unwanted signals of other frequencies. At this time, the shared terminal P20 of the band switch 20 is connected to none of the selection target terminals P21, P22, and P23. As such, the transmission signal of the first communication band hardly leaks toward the band switch 20 side. With this, the transmission signal of the first communication band inputted from the shared connection end 110 is outputted from the signal end 121 in a low loss state.

When the transmission signal of the second communication band is inputted from the shared connection end 110, the transmission signal is allowed to pass through the shared matching circuit 50, the band switch 20 and the communication band-dedicated matching circuit 62, and is outputted to the duplexer 42. As discussed above, by the shared matching circuit 50 and the communication band-dedicated matching circuit 62 being set so that impedance matching is performed on the second communication band, the transmission signal of the second communication band is inputted with low loss to the duplexer 42. The transmission filter of the duplexer 42 passes the transmission signal of the second communication band therethrough with low loss and attenuates unwanted signals of other frequencies. At this time, as described above, by the phase adjustment circuit 30 being so configured as to generate mismatching for the transmission signal of the second communication band, the transmission signal of the second communication band does not leak to the duplexer 41. With this, the transmission signal of the second communication band inputted from the shared connection end 110 is outputted from the signal end 122 in a low loss state.

When the transmission signal of the third communication band is inputted from the shared connection end 110, the transmission signal is allowed to pass through the shared matching circuit 50, the band switch 20 and the communication band-dedicated matching circuit 63, and is outputted to the duplexer 43. As discussed above, by the shared matching circuit 50 and the communication band-dedicated matching circuit 63 being set so that impedance matching is performed on the third communication band, the transmission signal of the third communication band is inputted with low loss to the duplexer 43. The transmission filter of the duplexer 43 passes the transmission signal of the third communication band therethrough with low loss and attenuates unwanted signals of other frequencies. At this time, as described above, by the phase adjustment circuit 30 being so configured as to generate mismatching for the transmission signal of the third communication band, the transmission signal of the third communication band does not leak to the duplexer 41. With this, the transmission signal of the third communication band inputted from the shared connection end 110 is outputted from the signal end 123 in a low loss state.

When the transmission signal of the fourth communication band is inputted from the shared connection end 110, the transmission signal is allowed to pass through the shared matching circuit 50, the band switch 20 and the communication band-dedicated matching circuit 64, and is outputted to the duplexer 44. As discussed above, by the shared matching circuit 50 and the communication band-dedicated matching circuit 64 being set so that impedance matching is performed on the fourth communication band, the transmission signal of the fourth communication band is inputted with low loss to the duplexer 44. The transmission filter of the duplexer 44 passes the transmission signal of the fourth communication band therethrough with low loss and attenuates unwanted signals of other frequencies. At this time, as described above, by the phase adjustment circuit 30 being so configured as to generate mismatching for the transmission signal of the fourth communication band, the transmission signal of the fourth communication band does not leak to the duplexer 41. With this, the transmission signal of the fourth communication band inputted from the shared connection end 110 is outputted from the signal end 124 in a low loss state.

As discussed above, by using the configuration of the present embodiment, the high frequency signals of the respective communication bands inputted from the shared connection end 110 are transmitted to their target signal ends 121, 122, 123, and 124 with low loss, and are outputted therefrom.

To be specific, since the transmission signal of the first communication band does not pass through the band switch, the loss due to the stated transmission signal being transmitted through the band switch is not brought about. Therefore, the transmission signal of the first communication band is transmitted with low loss.

Further, in the configuration of the present embodiment, because it is sufficient to use the band switch 20 including a smaller number of selection target terminals than the number of transmission bands to be demultiplexed, a conductor width of an FET constituting the band switch can be widened in comparison with a case in which a band switch including the same number of selection target terminals as the number of communication bands is used. This makes it possible to reduce the loss in the band switch. With this, the transmission signals of the second, third, and fourth communication bands are also transmitted with low loss.

Further, by using the configuration of the present embodiment, isolation among the communication bands can be sufficiently secured.

Although, in the above discussion, a relationship among the frequency bands of the transmission signals of the respective communication bands is not specifically described, it is more preferable for the stated relationship to be as described below.

The frequency band of the transmission signal of the first communication band is considerably distanced from the frequency bands of the transmission signals of the second, third, and fourth communication bands.

(A) The frequency of the transmission signal of the first communication band is considerably distanced from the frequencies of the transmission signals of the second, third and fourth communication bands, and is lower or higher than those thereof. By taking the above relationship, in the phase adjustment circuit 30, even with a simple configuration including a small number of constituent elements, an amount of phase change for the frequency band of the transmission signal of the first communication band can be made to be considerably different from amounts of phase change for the frequency bands of the transmission signals of the second, third, and fourth communication bands. This makes it possible to provide the phase adjustment circuit 30 in a simple configuration. Accordingly, the demultiplexing circuit 10 can be formed to be compact. In addition, transmission loss in the phase adjustment circuit 30 can be further reduced so that the transmission signal of the first communication band can be transmitted with lower loss.

(B) The same action effects as those of (A) can be obtained also under the following conditions: a transmission signal of a fifth communication band is transmitted in addition to those of the first, second, third, and fourth communication bands; on the frequency axis, the frequency bands of the second and third communication bands are close to each other, the frequency bands of the fourth and fifth communication bands are close to each other, the frequency band of the first communication band is arranged at an intermediate point between the frequency bands of the second and third communication bands and the frequency bands of the fourth and fifth communication bands; and, compared to the degree of closeness between the frequency bands of the second and third communication bands and between the frequency bands of the fourth and fifth communication bands, the degree of closeness of the frequency band of the first communication band with frequency bands of other communication bands is largely distanced.

Note that in the demultiplexing circuit 10, the communication band-dedicated matching circuits 62, 63, and 64 can be omitted if impedance matching that satisfies the specifications can be performed by the shared matching circuit 50. In addition, the shared matching circuit 50 can be also omitted if the impedance matching that satisfies the specifications can be performed by the communication band-dedicated matching circuits 62, 63, and 64.

As a variation, although not illustrated, the following configuration is further provided in FIG. 1. In the stated configuration, the transmission signal of the fifth communication band different from the first to fourth communication bands is inputted from the shared connection end 110, transmitted to the band switch 20 (the shared terminal P20, the selection target terminal P21), caused to branch from a connection point between the band switch 20 and the communication band-dedicated matching circuit 62, and outputted to a duplexer of the fifth communication band through a fifth communication band phase adjustment circuit. In the case where the demultiplexing circuit is constituted with four communication bands while using the fifth communication band of the above-mentioned variation, it is preferable to constitute the demultiplexing circuit using the first, second, third, and fifth communication bands with the fourth communication band being omitted. The shared matching circuit 50 can also be omitted.

Although the mode in which the duplexers 41, 42, 43, and 44 are provided is given in the above description, it may be permissible that these duplexers are merely filters. In this case, the signal ends 131, 132, 133, and 134 can be omitted.

Next, a demultiplexing circuit according to a second embodiment of the present disclosure will be described with reference to the drawings. FIG. 2 is a circuit block diagram of a high frequency front-end circuit including a demultiplexing circuit according to the second embodiment of the present disclosure.

The configuration of a demultiplexing circuit 10A of a high frequency front-end circuit 1A differs from that of the demultiplexing circuit of the high frequency front-end circuit 1 according to the first embodiment. A connection mode of a phase adjustment circuit 30A of the demultiplexing circuit 10A differs from that of the phase adjustment circuit of the demultiplexing circuit 10 according to the first embodiment. Only different portions from the high frequency front-end circuit 1 according to the first embodiment will be specifically described below.

One end of the phase adjustment circuit 30A is connected to the shared connection end 110 side of a shared matching circuit 50A.

With this configuration, the transmission signal of the first communication band inputted to the shared connection end 110 is inputted to the duplexer 41 only through the phase adjustment circuit 30A. With this, since the transmission signal of the first communication band is not transmitted through the shared matching circuit 50A, no loss is generated by the shared matching circuit 50A. Therefore, the transmission signal of the first communication band can be transmitted with lower loss.

Further, it is sufficient for the shared matching circuit 50A to change the impedance only for the transmission signals of the second, third, and fourth communication bands, and it is not needed to make any setting for the frequency band of the transmission signal of the first communication band. Then, in the case where the transmission signals of the second, third, and fourth communication bands are close to each other, the desired impedance matching can be obtained with a simple configuration. This makes it possible to reduce transmission loss in the shared matching circuit 50A and transmit the transmission signals of the first, second, and third communication bands as well with low loss.

Next, a demultiplexing circuit according to a third embodiment of the present disclosure will be described with reference to the drawings. FIG. 3 is a circuit block diagram of a high frequency front-end circuit including a demultiplexing circuit according to the third embodiment of the present disclosure.

The configuration of a demultiplexing circuit 10B of a high frequency front-end circuit 1B differs from that of the demultiplexing circuit of the high frequency front-end circuit 1 according to the first embodiment. The configuration of a band switch 20B of the demultiplexing circuit 10B differs from that of the band switch of the demultiplexing circuit 10 according to the first embodiment, and, in comparison with the demultiplexing circuit 10, the communication band-dedicated matching circuit 64 is omitted while a phase adjustment circuit 32 is added. Only different portions from the high frequency front-end circuit 1 according to the first embodiment will be specifically described below.

In the present embodiment, the frequency band of the transmission signal of the second communication band is close to the frequency band of the transmission signal of the third communication band, the frequency band of the transmission signal of the first communication band is distanced from the frequency bands of the transmission signals of the second and third communication bands, the frequency band of the transmission signal of the fourth communication band is distanced from the frequency bands of the transmission signals of the second and third communication bands, and the frequency band of the transmission signal of the first communication band is distanced from the frequency band of the transmission signal of the fourth communication band.

The band switch 20B includes a shared terminal P20, and selection target terminals P21 and P22. The shared terminal P20 is connected to the selection target terminal P21 when the transmission signal of the second communication band is transmitted. The shared terminal P20 is connected to the selection target terminal P22 when the transmission signal of the third communication band is transmitted. The shared terminal P20 is connected to none of the selection target terminals P21 and P22 when the transmission signals of the first and fourth communication bands are transmitted.

The phase adjustment circuit 32 corresponds to a "fourth communication band phase adjustment circuit" of the present disclosure. One end of the phase adjustment circuit 32 is connected to a predetermined position between the shared matching circuit 50 and the shared terminal P20 in a transmission path connecting the shared connection end 110 and the shared terminal P20 of the band switch 20B. The other end of the phase adjustment circuit 32 is connected to the signal end 124 with the duplexer 44 interposed therebetween. In the present embodiment, the signal end 124 corresponds to a "fourth signal end" of the present disclosure.

The phase adjustment circuit 32 performs phase-matching on the frequency band of the transmission signal of the fourth communication band. At the same time, the phase adjustment circuit 32 performs phase-mismatching on the frequency bands of the transmission signals of the first, second, and third communication bands. The phase adjustment circuit 32 is configured with a circuit including an inductor and a capacitor.

When the transmission signal of the fourth communication band is inputted from the shared connection end 110, the transmission signal is allowed to pass through the shared matching circuit 50 and the phase adjustment circuit 32, and is outputted to the duplexer 44. By the shared matching circuit 50 and the phase adjustment circuit 32 being set as discussed above, the transmission signal of the fourth communication band is inputted with low loss to the duplexer 44. The transmission filter of the duplexer 44 passes the transmission signal of the fourth communication band therethrough with low loss and attenuates unwanted signals of other frequencies. At this time, the shared terminal P20 of the band switch 20B is connected to none of the selection target terminals P21 and P22. As such, the transmission signal of the fourth communication band hardly leaks toward the band switch 20B side. With this, the transmission signal of the fourth communication band inputted from the shared connection end 110 is outputted from the signal end 124 in a low loss state.

With the above-discussed configuration, the transmission signal of the fourth communication band can also be transmitted with low loss without passing through the band switch 20B. In addition, since the selection target terminals of the band switch are further decreased in number, the loss in the band switch 20B can be reduced. With this, the transmission signals of the second and third communication bands can also be transmitted with low loss. Further, isolation among the communication bands can be sufficiently secured.

Next, a demultiplexing circuit according to a fourth embodiment of the present disclosure will be described with reference to the drawings. FIG. 4 is a circuit block diagram of a high frequency front-end circuit including a demultiplexing circuit according to the fourth embodiment of the present disclosure.

The configuration of a demultiplexing circuit 10C of a high frequency front-end circuit 1C differs from that of the demultiplexing circuit of the high frequency front-end circuit 1B according to the third embodiment. In the demultiplexing circuit 10C, the communication band-dedicated matching circuits 62 and 63 are omitted, compared to the demultiplexing circuit 10B according to the third embodiment. In the demultiplexing circuit 10C, the communication band-dedicated matching circuits 62 and 63 are omitted while a shared matching circuit 60C is added, compared to the demultiplexing circuit 10B according to the third embodiment. Only different portions from the high frequency front-end circuit 1B according to the third embodiment will be specifically described below.

A selection target terminal P21 of a band switch 20C is connected to the transmission filter of the duplexer 42. A selection target terminal P22 of the band switch 20C is connected to the transmission filter of the duplexer 43.

The shared matching circuit 60C is connected between a shared terminal P20 of the band switch 20C and the shared matching circuit 50. The shared matching circuit 60C is so set as to obtain impedance matching for the transmission signals of the second and third communication bands.

One end of the phase adjustment circuit 31 and one end of the phase adjustment circuit 32 are connected to a predetermined position between the shared matching circuit 50 and the shared matching circuit 60C.

With this configuration, the matching circuits can be further decreased in number so that the demultiplexing circuit 10C can be configured in a more simplified manner.

The above-discussed configuration is more effective in the case where the frequency band of the transmission signal of the second communication band is close to the frequency band of the transmission signal of the third communication band.

Next, a demultiplexing circuit according to a fifth embodiment of the present disclosure will be described with reference to the drawings. FIG. 5 is a circuit block diagram of a high frequency front-end circuit including a demultiplexing circuit according to the fifth embodiment of the present disclosure.

The configuration of a demultiplexing circuit 10D of a high frequency front-end circuit 1D differs from that of the demultiplexing circuit of the high frequency front-end circuit 1C according to the fourth embodiment. Connection modes of phase adjustment circuits 31D and 32D of the demultiplexing circuit 10D differ from those of the phase adjustment circuits of the demultiplexing circuit 10C according to the fourth embodiment. Only different portions from the high frequency front-end circuit 1C according to the fourth embodiment will be specifically described below.

Shared matching circuits 50D and 60D are connected in series between the shared connection end 110 and a shared terminal P20 of a band switch 20D.

One end of the phase adjustment circuit 31D is connected to the shared connection end 110 side of the shared matching circuit 50D. One end of the phase adjustment circuit 32D is connected to the shared matching circuit 60D side of the shared matching circuit 50D.

With this configuration, the connection positions of the phase adjustment circuits can be appropriately selected. This makes it possible to provide a circuit configuration in accordance with the specifications of each of the communication bands.

Next, a demultiplexing circuit according to a sixth embodiment of the present disclosure will be described with reference to the drawings. FIG. 6 is a circuit block diagram of a high frequency front-end circuit including a demultiplexing circuit according to the sixth embodiment of the present disclosure.

The configuration of a demultiplexing circuit 10E of a high frequency front-end circuit 1E differs from that of the demultiplexing circuit of the high frequency front-end circuit 1 according to the first embodiment. Only different portions from the high frequency front-end circuit 1 according to the first embodiment will be specifically described below.

The demultiplexing circuit 10E includes a band switch 20E, phase adjustment circuits 31E, 32E, 33E and 34E, the duplexers 41, 42, 43 and 44, and a shared matching circuit 50E.

The band switch 20E includes a shared terminal P20, and selection target terminals P21 and P22. The shared terminal P20 corresponds to a "shared terminal" of the present disclosure, the selection target terminal P21 corresponds to a "first selection target terminal" of the present disclosure, and the selection target terminal P22 corresponds to a "second selection target terminal" of the present disclosure.

The phase adjustment circuit 31E is connected between the selection target terminal P21 and the duplexer 41. The phase adjustment circuit 31E performs phase-matching on the frequency band of the transmission signal of the first communication band. At the same time, the phase adjustment circuit 31E performs phase-mismatching on the frequency band of the transmission signal of the second communication band. The phase adjustment circuit 31E corresponds to a "first communication band phase adjustment circuit" of the present disclosure.

The phase adjustment circuit 32E is connected between the selection target terminal P21 and the duplexer 42. The phase adjustment circuit 32E performs phase-matching on the frequency band of the transmission signal of the second communication band. At the same time, the phase adjustment circuit 32E performs phase-mismatching on the frequency band of the transmission signal of the first communication band. The phase adjustment circuit 32E corresponds to a "second communication band phase adjustment circuit" of the present disclosure.

The phase adjustment circuit 33E is connected between the selection target terminal P22 and the duplexer 43. The phase adjustment circuit 33E performs phase-matching on the frequency band of the transmission signal of the third communication band. At the same time, the phase adjustment circuit 33E performs phase-mismatching on the frequency band of the transmission signal of the fourth communication band.

The phase adjustment circuit 34E is connected between the selection target terminal P22 and the duplexer 44. The phase adjustment circuit 34E performs phase-matching on the frequency band of the transmission signal of the fourth communication band. At the same time, the phase adjustment circuit 34E performs phase-mismatching on the frequency band of the transmission signal of the third communication band.

The shared matching circuit 50E is connected between the shared terminal P20 of the band switch 20E and the shared connection end 110. The shared matching circuit 50E includes a circuit configuration that makes impedance approach the desired values to some degree for the frequency bands of the transmission signals of all the communication bands.

When the transmission signal of the first communication band is inputted from the shared connection end 110, the transmission signal is allowed to pass through the shared matching circuit 50E, the band switch 20E (the shared terminal P20, the selection target terminal P21) and the phase adjustment circuit 31E, and is outputted to the duplexer 41. As discussed above, by the shared matching circuit 50E and the phase adjustment circuit 31E being set so that impedance matching is performed on the first communication band, the transmission signal of the first communication band is inputted with low loss to the duplexer 41. At this time, as described above, by the phase adjustment circuit 32E being so configured as to generate mismatching for the transmission signal of the first communication band, the transmission signal of the first communication band does not leak to the duplexer 42. With this, the transmission signal of the first communication band inputted from the shared connection end 110 is outputted from the signal end 121 in a low loss state.

When the transmission signal of the second communication band is inputted from the shared connection end 110, the transmission signal is allowed to pass through the shared matching circuit 50E, the band switch 20E (the shared terminal P20, the selection target terminal P21) and the phase adjustment circuit 32E, and is outputted to the duplexer 42. As discussed above, by the shared matching circuit 50E and the phase adjustment circuit 32E being set so that impedance matching is performed on the second communication band, the transmission signal of the second communication band is inputted with low loss to the duplexer 42. At this time, as described above, by the phase adjustment circuit 31E being so configured as to generate mismatching for the transmission signal of the second communication band, the transmission signal of the second communication band does not leak to the duplexer 41. With this, the transmission signal of the second communication band inputted from the shared connection end 110 is outputted from the signal end 122 in a low loss state.

When the transmission signal of the third communication band is inputted from the shared connection end 110, the transmission signal is allowed to pass through the shared matching circuit 50E, the band switch 20E (the shared terminal P20, the selection target terminal P22) and the phase adjustment circuit 33E, and is outputted to the duplexer 43. As discussed above, by the shared matching circuit 50E and the phase adjustment circuit 33E being set so that impedance matching is performed on the third communication band, the transmission signal of the third communication band is inputted with low loss to the duplexer 43. At this time, as described above, by the phase adjustment circuit 34E being so configured as to generate mismatching for the transmission signal of the third communication band, the transmission signal of the third communication band does not leak to the duplexer 44. With this, the transmission signal of the third communication band inputted from the shared connection end 110 is outputted from the signal end 123 in a low loss state.

When the transmission signal of the fourth communication band is inputted from the shared connection end 110, the transmission signal is allowed to pass through the shared matching circuit 50E, the band switch 20E (the shared terminal P20, the selection target terminal P22) and the phase adjustment circuit 34E, and is outputted to the duplexer 44. As discussed above, by the shared matching circuit 50E and the phase adjustment circuit 34E being set so that impedance matching is performed on the fourth communication band, the transmission signal of the fourth communication band is inputted with low loss to the duplexer 44. At this time, as described above, by the phase adjustment circuit 33E being so configured as to generate mismatching for the transmission signal of the fourth communication band, the transmission signal of the fourth communication band does not leak to the duplexer 43. With this, the transmission signal of the fourth communication band inputted from the shared connection end 110 is outputted from the signal end 124 in a low loss state.

By employing the configuration of the present embodiment, the band switch constituted of a smaller number of selection target terminals than the number of communication bands can be used. This makes it possible to reduce loss in the band switch and transmit the transmission signals of the respective communication bands with low loss.

Next, a demultiplexing circuit according to a seventh embodiment of the present disclosure will be described with reference to the drawings. FIG. 7 is a circuit block diagram of a high frequency front-end circuit including a demultiplexing circuit according to the seventh embodiment of the present disclosure.

The configuration of a demultiplexing circuit 10F of a high frequency front-end circuit 1F differs from that of the demultiplexing circuit of the high frequency front-end circuit 1E according to the sixth embodiment. Only different portions from the high frequency front-end circuit 1E according to the sixth embodiment will be specifically described below.

In the demultiplexing circuit 10F, connection modes of a band switch 20F and phase adjustment circuits 31F and 34F, and the configuration of a shared matching circuit 50F are the same as those in the demultiplexing circuit 10E, while connection modes of phase adjustment circuits 32F and 33F, and impedance setting of the phase adjustment circuits 31F, 32F, 33F, and 34F are different from those in the demultiplexing circuit 10E.

The phase adjustment circuit 33F is connected between a selection target terminal P21 and the duplexer 43. The phase adjustment circuit 32F is connected between a selection target terminal P22 and the duplexer 42.

The phase adjustment circuit 31F performs phase-matching on the frequency band of the transmission signal of the first communication band. At the same time, the phase adjustment circuit 31F performs phase-mismatching on the frequency band of the transmission signal of the third communication band.

The phase adjustment circuit 33F performs phase-matching on the frequency band of the transmission signal of the third communication band. At the same time, the phase adjustment circuit 33F performs phase-mismatching on the frequency band of the transmission signal of the first communication band.

The phase adjustment circuit 32F performs phase-matching on the frequency band of the transmission signal of the second communication band. At the same time, the phase adjustment circuit 32F performs phase-mismatching on the frequency band of the transmission signal of the fourth communication band.

The phase adjustment circuit 34F performs phase-matching on the frequency band of the transmission signal of the fourth communication band. At the same time, the phase adjustment circuit 34F performs phase-mismatching on the frequency band of the transmission signal of the second communication band.

As described above, the basic configuration of the demultiplexing circuit 10F according to the present embodiment is the same as that of the demultiplexing circuit 10E according to the sixth embodiment, while connection combinations with respect to the selection target terminals of the band switch 20F are different compared to the sixth embodiment.

In the above-discussed embodiments, in the case where a difference between the center frequency of the frequency band of the transmission signal of the first communication band and the center frequency of the frequency band of the transmission signal of the second communication band is smaller than a difference between the center frequency of the frequency band of the transmission signal of the first communication band and the center frequency of the frequency band of the transmission signal of the third communication band, and a difference between the center frequency of the frequency band of the transmission signal of the fourth communication band and the center frequency of the frequency band of the transmission signal the third communication band is smaller than a difference between the center frequency of the frequency band of the transmission signal of the fourth communication band and the center frequency of the frequency band of the transmission signal of the second communication band, it is preferable to use the demultiplexing circuit 10F according to the present embodiment. With this, isolation among the communication bands can be more highly secured.

Next, a high frequency front-end circuit including a demultiplexing circuit according to an eighth embodiment of the present disclosure will be described with reference to the drawings. FIG. 8 is a cross-sectional view illustrating a general structure of a module component to configure a high frequency front-end circuit according to the eighth embodiment of the present disclosure.

A circuit configuration of a high frequency front-end circuit 1 according to the present embodiment is the same as that of the high frequency front-end circuit 1 according to the first embodiment.

The high frequency front-end circuit 1 includes a multilayer body 2 and a cover member 3. The multilayer body 2 is formed of a plurality of dielectric layers being laminated. In a predetermined layer of the multilayer body 2, a conductor pattern is formed (see a thick line extending in a lateral direction illustrated inside the multilayer body 2 in FIG. 8). Conductor patterns in different layers are appropriately connected with a conductive via (see a thick line extending in a longitudinal direction illustrated inside the multilayer body 2 in FIG. 8).

Land conductors are appropriately formed on a surface of the multilayer body 2. On the surface of the multilayer body 2, the band switch 20, the duplexers 41 and 42, passive elements constituting the shared matching circuit 50, passive elements constituting the communication band-dedicated matching circuit 62, the multi-band amplifier 80, and the main switch 90 are mounted using the land conductors. The duplexers 43 and 44, and passive elements constituting the communication band-dedicated matching circuits 63 and 64 are also mounted on the surface of the multilayer body 2. These circuit elements are connected by the conductor patterns formed in the multilayer body 2, thereby the circuit illustrated in FIG. 1 being configured. The insulative cover member 3 is formed on the surface of the multilayer body 2 to protect the above-mentioned circuit elements.

The phase adjustment circuit 30 is configured by the conductor patterns formed inside the multilayer body 2. To be more specific, an inductor and a capacitor constituting the phase adjustment circuit 30, and a connection conductor to make these circuit elements formed in a predetermined circuit pattern are provided by the conductor patterns formed inside the multilayer body 2.

With the above configuration, the high frequency front-end circuit can be miniaturized in comparison with a case in which all the constituent elements are formed on the circuit substrate. With this, the high frequency front-end circuit 1 excellent in transmission characteristics can be formed to be compact.

Next, a high frequency front-end circuit including a demultiplexing circuit according to a ninth embodiment of the present disclosure will be described with reference to the drawings. FIG. 9 is a cross-sectional view illustrating a general structure of a module component to configure a high frequency front-end circuit according to the ninth embodiment of the present disclosure.

A high frequency front-end circuit 1F according to the present embodiment is a circuit in which internal layer ground conductors 4 and ground via conductors 5 are further added to the high frequency front-end circuit 1 according to the eighth embodiment. Other configurations are the same as those of the high frequency front-end circuit 1 according to the eighth embodiment.

The internal layer ground conductors 4 are arranged between a formation position of the phase adjustment circuit 30 and a surface of the multilayer body 2F and between the formation position of the phase adjustment circuit 30 and another surface of the multilayer body 2F in the lamination direction. The ground via conductors 5 connect the internal layer ground conductors 4 in different layers of the multilayer body 2F to each other.

This configuration makes it possible to ensure isolation between the phase adjustment circuit 30 and other circuit elements as well as the conductor pattern constituting the circuit. With this, the impedance of the phase adjustment circuit 30 can be set more accurately to the desired value. Accordingly, the high frequency front-end circuit 1F having the desired characteristics can be configured with more certainty and accuracy.

It is to be noted that the configurations according to the eighth and ninth embodiments can be applied not only to the high frequency front-end circuit 1 according to the first embodiment but also to the high frequency front-end circuits according to the other embodiments.

1, 1A, 1B, 1C, 1D, 1E, 1F HIGH FREQUENCY FRONT-END CIRCUIT
2, 2F MULTILAYER BODY
3 COVER MEMBER
4 INTERNAL LAYER GROUND CONDUCTOR
5 GROUND VIA CONDUCTOR
10, 10A, 10B, 10C, 10D, 10E, 10F DEMULTIPLEXING CIRCUIT
20, 20B, 20C, 20D, 20E, 20F BAND SWITCH
30, 30A, 31, 31D, 31E, 31F, 32, 32D, 32E, 32F, 33E, 33F, 34E, 34F PHASE ADJUSTMENT CIRCUIT
41, 42, 43, 44 DUPLEXER
50, 50A, 50D, 50E, 50F, 60C, 60D SHARED MATCHING CIRCUIT
62, 63, 64 COMMUNICATION BAND-DEDICATED MATCHING CIRCUIT
80 MULTI-BAND AMPLIFIER
90 MAIN SWITCH
110 SHARED CONNECTION END
121, 122, 123, 124, 131, 132, 133, 134 SIGNAL END
P20 SHARED TERMINAL
P21, P22, P23 SELECTION TARGET TERMINAL
P90 SHARED TERMINAL
P91, P92, P93, P94 SELECTION TARGET TERMINAL
Pan ANTENNA TERMINAL
Prx1, Prx2, Prx3, Prx4 RECEPTION SIGNAL OUTPUT TERMINAL
Ptx TRANSMISSION SIGNAL INPUT TERMINAL

The invention claimed is:

1. A demultiplexing circuit configured to demultiplex high frequency signals of a first communication band, a second communication band, and a third communication band, each of the first, second, and third communication bands having different frequency bands, the demultiplexing circuit comprising:

a shared connection end to which each of the high frequency signals of the first, second, and third communication bands are input;

a first signal end from which the high frequency signal of the first communication band is output;

a second signal end from which the high frequency signal of the second communication band is output;

a third signal end from which the high frequency signal of the third communication band is output;

a band switch comprising a shared terminal connected to the shared connection end, a first target terminal connected to the second signal end, and a second target terminal connected to the third signal end, wherein the first target terminal and the second target terminal are selectively connected to the shared terminal based on a communication band of a high frequency signal input to the shared connection end; and a first communication band phase adjustment circuit connected at a first end to the first signal end, and at a second end between the shared connection end and the shared terminal.

2. The demultiplexing circuit according to claim 1, further comprising:

a shared matching circuit connected between the shared terminal and the shared connection end, wherein the second end of the first communication band phase adjustment circuit is connected between the shared connection end and the shared matching circuit.

3. The demultiplexing circuit according to claim 1, further comprising:

a shared matching circuit connected between the shared terminal and the shared connection end, wherein the second end of the first communication band phase adjustment circuit is connected between the shared terminal and the shared matching circuit.

4. The demultiplexing circuit according to claim 1, further comprising:

a fourth signal end from which a high frequency signal of a fourth communication band different from the first, second, and third communication bands is output; and a fourth communication band phase adjustment circuit connected at a first end to the fourth signal end and at a second end between the shared connection end and the shared terminal.

5. The demultiplexing circuit according to claim 4, further comprising:

a shared matching circuit connected between the shared terminal and the shared connection end, wherein the second end of the first communication band phase adjustment circuit is connected between the shared connection end and the shared matching circuit, and the second end of the fourth communication band phase adjustment circuit is connected between the shared terminal and the shared matching circuit.

6. The demultiplexing circuit according to claim 4, further comprising:

a shared matching circuit connected between the shared terminal and the shared connection end, wherein the second end of the first communication band phase adjustment circuit is connected between the shared terminal and the shared matching circuit, and the second end of the fourth communication band phase adjustment circuit is connected between the shared terminal and the shared matching circuit.

7. The demultiplexing circuit according to claim 1, further comprising:

at least one of:

a second communication band-dedicated matching circuit connected between the first target terminal and the second signal end, and a third communication band-dedicated matching circuit connected between the second target terminal and the third signal end.

8. The demultiplexing circuit according to claim 1, further comprising:

a fifth signal end from which a high frequency signal of a fifth communication band different from the first, second, and third communication bands is output, and which is connected to the first target terminal;

a second communication band phase adjustment circuit connected between the second signal end and the first target terminal; and a fifth communication band phase adjustment circuit connected between the fifth signal end and the first target terminal.

9. The demultiplexing circuit configured to demultiplex high frequency signals of a first communication band, a second communication band, and a third communication band, each of the first, second, and third communication bands having different frequency bands, the demultiplexing circuit comprising:

a shared connection end to which high frequency signals of the first, second, and third communication bands are input;

a first signal end from which the high frequency signal of the first communication band is output;

a second signal end from which the high frequency signal of the second communication band is output;

a third signal end from which the high frequency signal of the third communication band is output;

a band switch comprising a shared terminal connected to the shared connection end, a first target terminal connected to the first signal end and the second signal end, and a second target terminal connected to the third signal end, wherein the first target terminal and the second target terminal are selectively connected to the shared terminal based on a communication band of a high frequency signal input to the shared connection end;

a first communication band phase adjustment circuit connected between the first signal end and the first target terminal; and a second communication band phase adjustment circuit connected between the first signal end and the second target terminal.

10. The demultiplexing circuit according to claim 1, wherein a difference between a frequency band of the first communication band and a frequency band of the second communication band or a difference between the frequency band of the first communication band and a frequency band of the third communication band is greater than a difference between the frequency band of the second communication band and the frequency band of the third communication band.

11. The demultiplexing circuit according to claim 10, wherein the frequency band of the first communication band is not between the frequency band of the second communication band and the frequency band of the third communication band.

12. The demultiplexing circuit according to claim 10, wherein the frequency band of the first communication band is between the frequency band of the second communication band and the frequency band of the third communication band.

13. The demultiplexing circuit according to claim 9, wherein a difference between a frequency band of the first communication band and a frequency band of the second communication band or a difference between the frequency band of the first communication band and a frequency band of the third communication band is greater than a difference between the frequency band of the second communication band and the frequency band of the third communication band.

14. The demultiplexing circuit according to claim 13, wherein the frequency band of the first communication band is not between the frequency band of the second communication band and the frequency band of the third communication band.

15. The demultiplexing circuit according to claim 13, wherein the frequency band of the first communication band is between the frequency band of the second communication band and the frequency band of the third communication band.

* * * * *